United States Patent [19]

Arai et al.

[11] Patent Number: 4,872,787
[45] Date of Patent: Oct. 10, 1989

[54] METHOD OF DRILLING PRINTED CIRCUIT BOARD

[75] Inventors: Kunio Arai, Atsugi; Hiromi Nishiyama, Ebina; Hiroshi Aoyama, Tokyo; Yasuhiko Kanaya, Machida, all of Japan

[73] Assignee: Hitachi Seiko Ltd., Tokyo, Japan

[21] Appl. No.: 106,439

[22] Filed: Oct. 9, 1987

[30] Foreign Application Priority Data

Dec. 19, 1986 [JP] Japan ................. 61-301285

[51] Int. Cl.⁴ .................. B23B 35/00; B23B 4/00; B23B 47/00
[52] U.S. Cl. ..................... 408/1 R; 408/17; 408/95
[58] Field of Search ........... 408/1 R, 17, 95, 704, 408/705, 97

[56] References Cited

U.S. PATENT DOCUMENTS

| | | | |
|---|---|---|---|
| 2,768,539 | 10/1956 | Wollenhaupt et al. | 408/17 |
| 3,129,613 | 4/1964 | Burg | 408/17 |
| 3,637,318 | 1/1972 | Hayes | 408/17 |
| 3,680,970 | 8/1972 | Deschner | 408/17 |
| 4,123,188 | 10/1978 | Deremo et al. | 408/17 |
| 4,212,570 | 7/1980 | Larsson | 408/95 |
| 4,269,549 | 5/1981 | Block | 408/1 R |
| 4,311,419 | 1/1982 | Block | 408/1 R |
| 4,340,326 | 7/1982 | Buonauro et al. | 408/16 |
| 4,420,685 | 12/1983 | Ohtani et al. | 250/222.2 |
| 4,473,329 | 9/1984 | Aoshima et al. | 408/11 |
| 4,605,344 | 8/1986 | Hartmann | 408/1 R |

FOREIGN PATENT DOCUMENTS

| | | | |
|---|---|---|---|
| 19905 | 12/1955 | Fed. Rep. of Germany . | |
| 205209 | 11/1984 | Japan . | |
| 263606 | 12/1985 | Japan | 408/1 R |
| 136705 | 6/1986 | Japan | 408/1 R |
| 375967 | 4/1964 | Switzerland . | |
| 2019269 | 10/1979 | United Kingdom | 408/95 |

Primary Examiner—Gil Weidenfeld
Assistant Examiner—Daniel W. Howell
Attorney, Agent, or Firm—Antonelli, Terry & Wands

[57] ABSTRACT

In a method of drilling a printed circuit board according to the present invention, an entry feed rate at which a drill is fed into the printed circuit boards during the initial stage of drilling is made slightly smaller than a drilling feed rate at which the drill is fed while it is drilling a hole through the printed circuit boards, so as to enhance the accuracy at which holes are located. One drilling operation includes a plurality of drilling feeds of the drill, and pulled-out positions of the drill which are reached by the drill between adjacent drilling feed rate are set within a range in which the pressure of a pressure foot is effective. This can prevent the stacked printed circuit boards from shifting and increase the accuracy at which the holes are located.

20 Claims, 4 Drawing Sheets

METHOD OF DRILLING PRINTED CIRCUIT BOARD

BACKGROUND OF THE INVENTION

1. Field of the Invention

The present invention relates to a method of drilling a printed circuit board using a drill.

2. Description of the Related Art

In the drilling of printed circuit boards to form through-holes, printed circuit boards 1 are generally stacked between an entry board 2 and a back up board 3 as shown in FIG. 5. A drill 4 rotated at a predetermined speed is disposed above this stack and fed until the bit thereof reaches the back up board 3.

With this drilling method, if three 1.6 mm thick printed circuit boards 1 are stacked on top of each other, if the entry and back-up boards 2, 3 placed above and below this stack have thicknesses of 1 mm and 3 mm, respectively, and if the drilled hole is to drill the back up board 3 by 1 mm, the depth Lh of the hole is 6.8 mm.

If the diameter of the hole is 1.2 mm, the ratio (Lh/D) of the hole depth Lh to the hole diameter D is 5.8.

When the aspect ratio of the hole depth Lh to the hole diameter D is relatively small (6 or less) as in the above example, it is possible to drill a good-240 quality, accurately-located hole by feeding the drill 4 from a drill resting position or drill start position A to a hole bottom position or drill end position B at a predetermined drilling feed rate then feeding it back from the hole bottom position B to the drill start position A at a predetermined rapid feed rate.

On the other hand, if the hole diameter D is 1 mm or less, e.g., 0.8 mm, the ratio of the hole depth Lh to the hole diameter D is 8.5.

If a hole of such a large ratio of Lh to D is drilled by feeding the drill 4 from the drill start position A to the hole bottom position B is one stage process, hole is often choked with debris. This increases the surface roughness of the inner wall of the drilled hole, and may also cause smears. Further, the thrust load on the drill 4 increases during drilling, rises drill temperature. This in turn increases the wear of the drill bit.

Accordingly, a proposal has been made to make a hole by drilling it in several stages, as shown in FIG. 6.

For example, the distance between the drill start position A and the hole bottom position B is divided into three stages with intermediate positions $M_1$ and $M_2$ set partway down the hole. The drill is fed from the drill start position A to the intermediate position $M_1$ at a drilling feed rate $V_F$, then back to the drill start position A at a rapid feed rate $V_R$. Subsequently, the drill is fed from the drill start position A at the rapid feed rate $V_R$ to the intermediate position $M_1$, at which the drill feed rate is switched over to the drilling feed rate $V_F$, is fed further down at the drilling feed rate $V_F$ to the intermediate position $M_2$, and is then fed back at the rapid feed rate $V_R$ to the drill start position A from the intermediate position $M_2$. Thereafter, the drill is fed from the drill start position A at the rapid feed rate $V_R$ to the intermediate position $M_2$, at which the drill feed rate is switched over to the drilling feed rate $V_F$, is fed further at the drilling feed rate $V_F$ to the hole bottom position B, and is fed back at the rapid feed rate $V_R$ to the drill start position A.

In the above-described method, since the drill is fed retracted between the drill start position A and the intermediate positions $M_1$ and $M_2$ to make the hole, chips filling the drill flute are shaken off and discharged while the drill is retracting to the drill start position A after coming out of the entry board. Therefore, the problems caused by chip clogging are eliminated, and the drilling of a good quality hole is enabled. In addition, drill bit wear can be reduced.

If the diameter of a hole to be drilled is even smaller and so the diameter of the drill to be used is even smaller, the rigidity of the drill is reduced. In such a case, the above-described method has a disadvantage in that, when the drill bit makes contact with the entry board or the printed circuit board, it may not enter the desired part of the entry board or printed circuit board; the top end of the drill bit may slip sideways from a desired location where the board is to be drilled. This results in a reduction in hole positioning accuracy, or breakage of the drill.

Furthermore, since the drill is fed and retracted between the drill start position and the intermediate positions to drill, the time required for drilling is extended, thereby reducing the output. More specifically, a type of printed circuit board may require several thousands or several tens of thousands of holes. Therefore, if the time required to drill one hole increases by 0.1 second, it means that it will take between several minutes to several hours longer to complete the drilling of the printed circuit board.

SUMMARY OF THE INVENTION

In view of the above described problems of the prior art, an object of the present invention is to provide a method of drilling a printed circuit board which enables a hole to be drilled highly accurately and highly efficiently.

To achieve the above-described object, the present invention provides, in one of its aspects, a method of drilling a printed circuit board which includes the steps of:

setting in the depthwise direction of a hole a drill start position at which a pressure foot does not make contact with the printed circuit board, a pulled-out position at which the pressure of the pressure foot acts on the printed circuit board and at which the drill bit is located just above the printed circuit board, a plurality of intermediate positions which are successively lower in the depthwise direction of the hole, and a hole bottom position at which the drilling is completed; and setting as the drill feed rate an entry feed rate at which the drill is fed into the printed circuit board or an entry board, a drilling feed rate which is suitable for drilling, and a rapid feed rate which is faster than the drilling feed rate.

Further, the present invention provides, in another of its aspects, a method of drilling a printed circuit board which includes, in addition to the steps taken by the first aspect of the present invention, a step of setting switch-over positions above the individual intermediate positions.

According to the first aspect of the present invention, the drilling of a hole includes the steps of:

(1) feeding the drill from the drill start position to a first intermediate position at the initial feed speed or entry drilling feed rate, (2) moving the drill from the first intermediate position to the pulled-out position at the rapid feed rate, (3) feeding the drill from the pulled-out position to the next intermediate position at the drilling feed rate, and repeating the steps of (2) and (3), ending with returning the drill to the drill start position at the rapid feed rate after it has reached the hole bottom position.

According to the second aspect of the present invention, the drilling of a hole includes the steps of:

(1) feeding the drill from the drill start position to the pulled-out position at the rapid feed rate, (2) feeding the drill from the pulled-out position to the first intermediate position at the initial feed speed or entry drilling feed rate, (3) feeding the drill from the first intermediate position to the pulled-out position, then feeding to the corresponding switchover position at the rapid feed rate, (4) feeding the drill from the switchover position to the next intermediate position at the drilling feed rate, and (5) repeating the steps of (3) and (4), ending with returning the drill to the drill start position at the rapid feed rate after it has reached the hole bottom position.

Thus, according to the first aspect of the present invention, it is possible to enhance the quality of the hole to be drilled and the accuracy in locating the hole. It is also possible to reduce the time required to drill a hole, and thereby increase output, by feeding the drill repeatedly between the pulled-out position C and the intermediate positions, i.e., by omitting the repeated feeding of the drill between the pulled-out position C and the drill start position. According to the second aspect of the present invention, it is possible to further increase the output over that of the first aspect of the invention by repeatedly feeding the drill at the rapid feed rate between the pulled-out position C and switchover positions H.

The above and other objects, features and advantages of the present invention will become more apparent from the description set forth hereinafter, when considered in conjunction with the accompanying drawings.

DETAILED DESCRIPTION OF THE PREFERRED EMBODIMENTS

Figure 7:
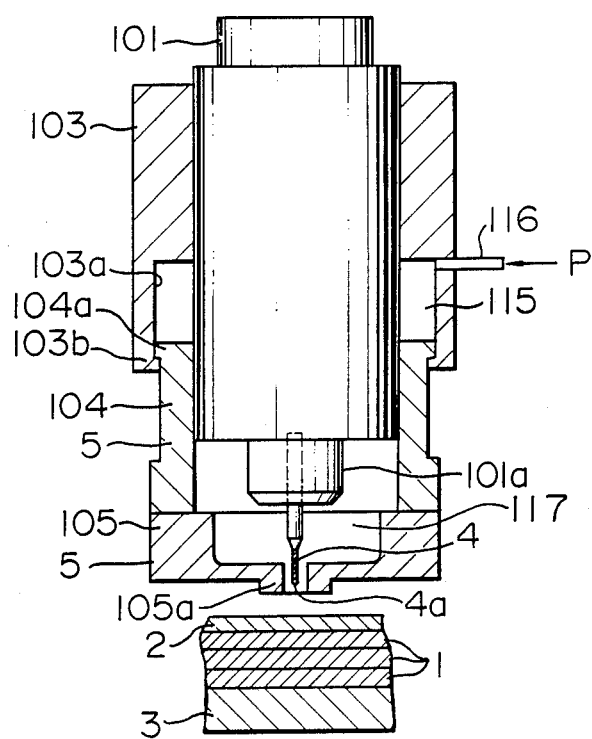
FIG. 7 is a cross-sectional view of an example of a drill and a pressure foot employed in a printed circuit board drilling machine employing the present invention.

Prior to giving a description of the preferred embodiments of the present invention, the structure of a drill and a pressure foot of a printed circuit board drilling machine as employed in the present invention will be described by way of example with reference to FIG. 7 (for further detail, refer to commonly assigned Japanese Patent Application Laid-Open No. 205209/1984).

In drilling a hole through stacked printed circuit boards 1 by a drill 4 of the drilling machine, the printed circuit boards 1 must be clamped firmly so that the position of each does not shift in relation to the others while the drill 4 is being pulled away from them after they have been drilled to a predetermined depth. Accordingly, the drilling machine is constructed such that the drill 4 thereof is mounted via a chuck 101a at the leading end of a spindle 101, and that a pressure foot 5 is disposed close to the top end of the drill 4 in such a way as to be movable along the axis of the drill 4. The pressure foot 5 comprises a piston 104 slidably engaged with a slide portion 103a of a cylinder 103 which is disposed outside the spindle in such a manner as to be coaxial therewith, and a collar 105 mounted on the other end of the piston 104.

A flange 103b formed at the lower end of the cylinder 103 engages with a flange 104a formed at the upper end of the piston 104, and the inner wall of the cylinder 103, the outer wall of the spindle 101, and the flange 104a of the piston 104 together form a chamber 115 into which pressurized air under predetermined pressure P is supplied via a fluid conduit 116 by an air source (which is not shown).

The cylinder 103 is mounted on an elevating device (not shown) in such a manner that it can move down toward and up away from a stack comprising an entry board 2, a plurality of printed circuit boards 1, and a back up board 3 disposed on a base (not shown) below the cylinder 103.

When the printed circuit boards 1 are drilled, the cylinder 103 is lowered together with the spindle 101, so that a protrusion 105a formed at the bottom of the collar 105 contacts the entry board 2 disposed on the printed circuit boards 1, pressing down the printed circuit boards and the entry board 2 against the back up board 3 on the base (not shown) and thereby clamping the printed circuit boards in a fixed position. Thereafter, the spindle 101 is further lowered. During this lowering the flange 103b of the cylinder 103 separates from the flange 104a of the piston 104, and the flange 104a slides along the inner wall 103a of the cylinder 103 so as to decrease the capacity of the chamber 115. A bit 4a of the drill 4 then projects out of the collar 105 so as to provide for drilling of a hole of predetermined depth in the printed circuit boards 1 in accordance with the drilling method of the present invention. During drilling, the space 117 around the drill 4 is evacuated to blow the chips. After the drilling has been completed, the spindle 101 returns to its original position (rises). As the spindle 101 rises, the capacity of the chamber 115 increases. Thereafter, the collar 105 of the pressure foot 5 is pulled up after the drill 4 has been pulled up and out of the holes drilled in the printed circuit board stack 1 and the entry board 2.

Figure 1:
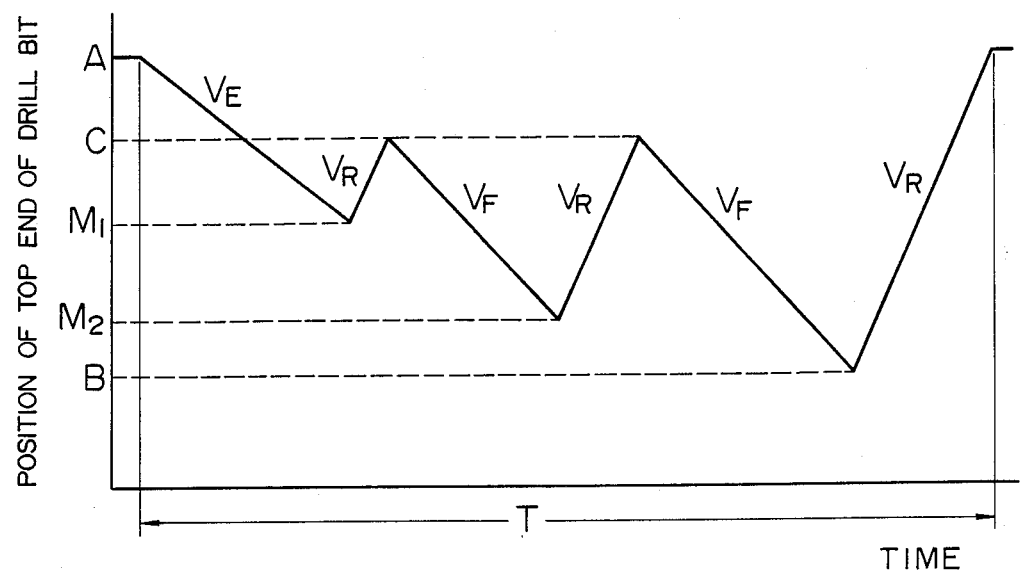
FIG. 1 is a graph illustrating the relationship between the position of a drill and the time required for the drill to be fed according to a first aspect of the present invention.
Figure 2:
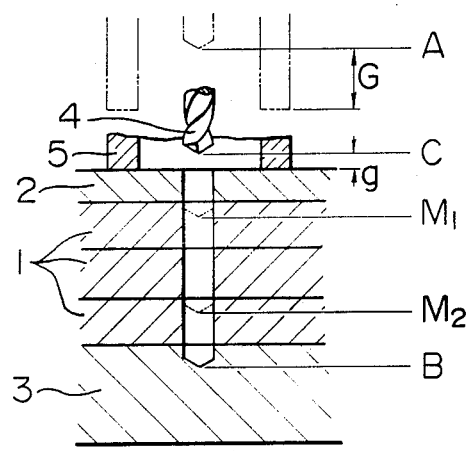
FIG. 2 is a cross-sectional view of a state in which a hole is being drilled through printed circuit boards.

A first embodiment of the present invention will be hereinunder described with reference to FIGS. 1 and 2.

The printed circuit boards 1 to be drilled are stacked between the entry and back up boards 2 and 3, and the printed circuit boards 1 and the entry and back up boards 2 and 3 are firmly pressed together by the pressure foot 5. A drilling machine includes the drill 4 and the pressure foot 5 which is movable along the axis of the drill 4 and is urged downward.

The drilling is started from a drill start position A. When the drill 4 is located at this position, the pressure foot 5 is not in contact with the entry board 2. At this time, the top end of the drill 4 is spaced vertically from the bottom of the pressure foot 5 by a gap G.

A reference symbol C designates a pulled-out position at which the pressure foot 5 is in contact with the entry board 2 and at which the top end of the drill 4 is located just above the entry board 2. At this time, a gap formed between the top end of the drill 4 and the bottom of the pressure foot 5 has a length g. In other words, the pressure foot 5 is pressed down against the entry board 2, the printed circuit boards 1, and the back up board 3 by a force corresponding to the difference between the gap G and the gap g.

Reference symbols M1 and M2 indicate intermediate positions which are successively lower in the depthwise direction of a hole. The M1 corresponds to a position at which the drill 4 drills the uppermost printed circuit board 1.

A reference symbol B designates a hole bottom position which corresponds to a position at which the drill 4 drills the back up board 3 by about 1 mm.

A reference symbol $V_E$ denotes an entry feed rate. This is set to a value which ensures that the drill 4 can be caused to drill the entry board 2 and the printed circuit boards 1.

A reference symbol $V_F$ indicates a drilling feed rate which is set to a value which ensures that the drilled hole is of optimum quality.

A reference symbol $V_R$ indicates a rapid feed rate which is set to a value sufficient to ensure that the quality of the drilled hole is not lowered.

In drilling the printed circuit boards 1, the drill 4 is first fed at the entry feed rate $V_E$ from the drill start point A to the first intermediate position M1 past the intermediate resting position or pulled-out position C so as to form a hole which drills the printed circuit board 1 located on top of the stack through the entry board 2. The drill 4 is then retracted from the intermediate position M1 to the pulled-out position C at the rapid feed rate $V_R$. During this time, the chips attached to the drill 4 are shaken off and the drill 4 which has heated up during drilling cools down. Subsequently, the drill 4 is fed from the pulled-out position C to the next intermediate position M2 at the drilling feed rate $V_F$ so as to effect drilling of the printed circuit boards 1. At this time, the previously drilled hole serves as a guide for the drill 4, relocating the drill 4 accurately at the position to be drilled. The drill 4 is then fed from the intermediate position M2 to the pulled-out position C at the rapid feed rate $V_R$, during which period the chips are sent up out of the hole and the drill 4 cools down. Thereafter, the drill 4 is fed from the pulled-out position C to the hole bottom position B at the drilling feed rate $V_F$ so as to make a hole which reaches the back up board 3. Finally, the drill 4 is retracted from the drill end position or hole bottom position B to the drill start point A at the rapid feed rate $V_R$ to complete the drilling of the hole.

The printed circuit boards 1 and the drill 4 are then fed relative to each other parallel to the upper surface of the printed circuit boards 1 for subsequent drilling.

Figure 3:
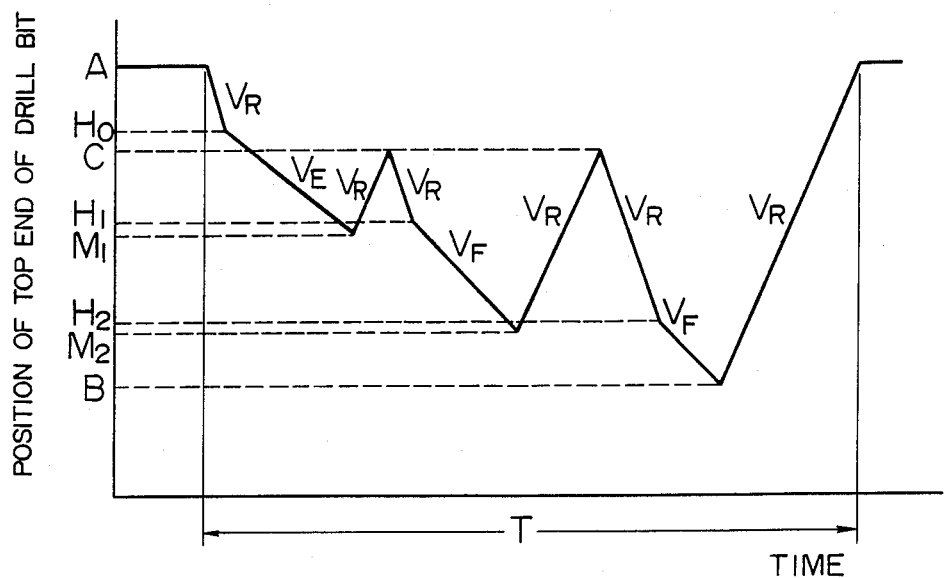
FIG. 3 is a graph illustrating the relationship between the position of the drill and the time required for the drill to be fed according to a second aspect of the present invention.
Figure 4:
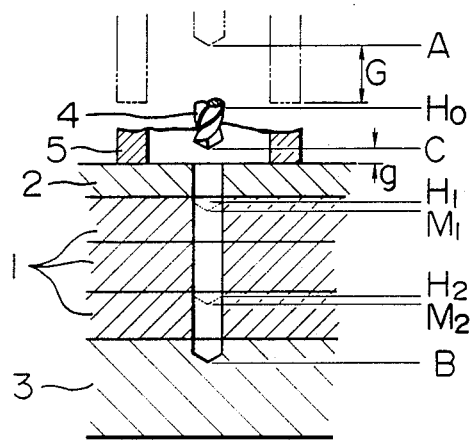
FIG. 4 is a cross-sectional view of a state in which a hole is being drilled through printed circuit boards.
Figure 5:
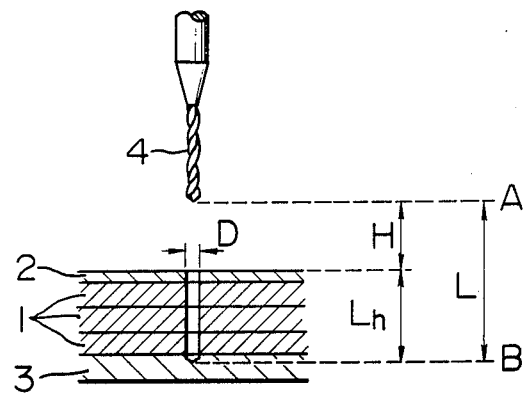
FIG. 5 is a cross-sectional view showing a state in which a hole is being drilled through printed circuit boards in the prior art.
Figure 6:
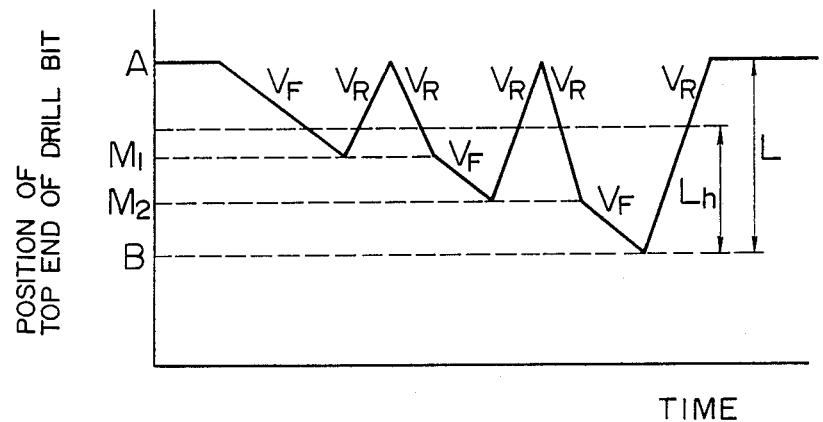
FIG. 6 is a graph illustrating the relationship between the position of the drill and the time required for the drill to be fed in the prior art.

A second embodiment of the present invention will now be described with reference to FIGS. 3 and 4, in which the same reference numerals and symbols are used to designate those parts which are the same as those of the first embodiment.

Reference symbols $H_0$, $H_1$, $H_2$ denote switchover positions. The switchover position $H_0$ is a position at which the pressure foot 5 makes contact with the entry board 2 or a position which is slightly above that position. The switchover positions $H_1$ and $H_2$ are located above the intermediate positions $M_1$, $M_2$, respectively, with a predetermined distance therebetween.

In drilling the printed circuit boards 1, the drill 4 is first moved from the drill start position A to the switchover position $H_0$ at the rapid feed rate $V_R$. The drill 4 is then moved from the switchover position $H_0$ to the intermediate position $M_1$ past the pulled-out position C at the initial or entry feed rate $V_E$ so as to make a hole which drills the printed circuit board 1 located on the top of the pile through the entry board 2. Subsequently, the drill 4 is moved from the intermediate position $M_1$past the switchover position $H_1$ to the pulled-out position C at the rapid feed rate $V_R$. Thereafter, the drill 4 is moved to the switched over position $H_1$ at the rapid feed rate $V_R$ and then further to the next intermediate position $M_2$ at the drilling feed rate $V_F$ so as to make a hole which passes through the printed circuit boards 1. The drill 4 is then moved from the intermediate position $M_2$ past the switchover position $H_2$ to the pulled-out position C at the rapid feed rate $V_R$. Thereafter, the drill 4 is fed from the switchover position $H_2$ to the hole bottom position B at the drilling feed rate $V_F$so as to make a hole which reaches the pick up board 3. Finally, the drill 4 is fed from the hole bottom position B to the drill start position A at the rapid feed rate $V_R$.

Thus, the time T required for drilling can be reduced to less than that of the first embodiment by increasing the stages in which the drill 4 is fed at the rapid feed rate $V_R$. If the drill 4 is fed at a rate which is faster than the rapid feed rate $V_R$ between the drill start position A and the switchover position $H_0$, the time T can be further reduced.

In the above-described embodiments, two intermediate positions $M_1$ and $M_2$ were set. However, more than two intermediate positions may be provided.

As the depth of the hole increases, the discharge of chips becomes more difficult. Therefore, if the number of printed circuit boards 1 to be stacked is increased so that the hole to be made becomes deeper, it is preferable that the spacing between the intermediate positions $M_m$ and $M_n$ is made narrower.

In the above-described first and second embodiments, the printed circuit boards 1 are pressed down by the pressure foot 5 from immediately after the drilling is started to immediately before the drill 4 is returned to the drill start position A. In consequence, the printed circuit boards 1 do not float or shift during the drilling, and this enables highly-accurate drilling of a plurality of stacked printed circuit boards 1.

What is claimed is:

1. A method of drilling a hole in a printed circuit board in which stacked printed circuit boards are fixed by a pressure foot for the drilling, comprising the steps of:

setting a drill start position at which said pressure foot is not in contact with said printed circuit boards, a pulled-out position at which the pressure of said pressure foot acts on said printed circuit boards and at which a drill bit is located just above said stacked printed circuit boards, a plurality of intermediate positions successively located at certain points in a depthwise direction of said hole, and a hole bottom position at which the drilling of said hole is completed;

setting and entry feed rate at which said drill bit initially drills said printed circuit boards, a drilling feed rate which ensures satisfactory drilling, and a rapid feed rate which is faster than said drilling feed rate;

repeating, after said drill has been fed from said drill start position to a first intermediate position at said entry feed rate, a cycle which includes a step of feeding said drill from said first intermediate position to said pulled-out position at said rapid feed rate and a step of feeding said drill from said pulled out position to a next intermediate position at said drilling feed rate; and returning said drill to said drill start position at said rapid feed rate after said drill has reached said hole bottom position.

2. A method of drilling a printed circuit board according to claim 1, wherein the step of setting said intermediate positions comprises spacing the intermediate positions in relation to the number of circuit boards in a stack such that the spacing decreases as the number increases.

3. A method of drilling a hole in a printed circuit board in which stacked printed circuit boards are fixed for drilling by a pressure foot for the drilling, comprising the steps of:

setting a drill start position at which said pressure foot is not in contact with said printed circuit boards, a pulled-out position at which the pressure of said pressure foot acts on said printed circuit boards and at which a drill bit is located just above said stacked printed circuit boards, a plurality of intermediate positions successively located at certain points in a depthwise direction of said hole, switchover positions which are each located a predetermined distance above corresponding intermediate positions, and a hole bottom position at which the drilling of said hole is completed;

setting an entry feed rate at which said drill bit initially drills said printed circuit boards, a drilling feed rate which ensures satisfactory drilling, and a rapid feed rate which is faster than said drilling feed rate;

repeating, after said drill has been fed from said drill start position to said pulled-out position at said rapid feed rate, then from said pulled-out position to a first intermediate position at said entry feed rate, a cycle which includes a step of feeding said drill from said first intermediate position to a switchover position via said pulled-out position at said rapid feed rate and a step of feeding said drill from said switchover position to a next intermediate position at said drilling feed rate; and returning said drill to said drill start position at said rapid feed rate after said drill has reached said hole bottom position.

4. A method of drilling a printed circuit board according to claim 3, wherein the steps of setting said intermediate positions comprises spacing the intermediate positions in relation to the number of circuit boards in a stack such that the spacing decreases as the number increases.

5. A method for drilling a hole in a workpiece, comprising the steps of:

moving a pressure foot associated with a drill into contact with the workpiece, and moving a drill bit associated with the drill from a first position into the workpiece, toward the first position and again into the workpiece while maintaining the pressure foot in constant contact with the workpiece.

6. A method for drilling a hole according to claim 5, wherein the drill bit movement produces a hole with an aspect ratio, as defined by the length of the hole to the hole diameter, higher than 8.5.

7. A method for drilling a hole according to claim 6, wherein the aspect ratio is at least 10.

8. A method for drilling a hole according to claim 5, wherein the workpiece is a thin, flexible material.

9. A method for drilling a hole according to claim 8, wherein the drill bit movement produces a hole with an aspect ratio, as defined by the length of the hole to the hole diameter, higher than 8.5.

10. A method for drilling a hole according to claim 9, wherein the aspect ratio is at least 10.

11. A method for drilling a hole according to claim 5, wherein the workpiece comprises at least one printed circuit board.

12. A method for drilling a hole according to claim 11, wherein the drill bit movement produces a hole having an aspect ratio, as defined by the length of the hole to the hole diameter, higher than 8.5.

13. A method for drilling a hole according to claim 12, wherein the workpiece further comprises an entry board on one side of the at least one printed circuit board.

14. A method for drilling a hole according to claim 12, wherein the workpiece further comprises a back-up board on one side of the at least one printed circuit board.

15. A method for drilling a hole according to claim 14, wherein the workpiece further comprises an entry board on an opposite side of the at least one printed circuit board.

16. A method for drilling a hole having an aspect ratio, as defined by the length of the hole to the hole diameter, higher than 8.5 in an object, comprising the steps of:

moving a pressure foot associated with a drill from a drill-start position out of contact with the object to a pulled-out position in which the pressure foot but not the drill exerts pressure on the object;

moving the drill into the object at an entry feed rate to initiate drilling to a first intermediate position on the object while maintaining the pressure exerted by the pressure foot;

moving the drill to a pulled-out position at a feed rate which is higher than the entry feed rate while maintaining the pressure exerted by the pressure foot; and moving the drill to a second intermediate position on the object at a drilling feed rate lower than the rapid feed rate while maintaining the pressure exerted by the pressure foot.

17. A method according to claim 16, wherein the object comprises an entry board, a back-up board and at least one printed circuit board between the entry board and back-up board.

18. A method for drilling a hole having an aspect ratio, as defined by the length of the hole to the hole diameter, higher than 8.5 in stacked circuit boards, comprising moving a pressure foot associated with a drill from a drill-start position out of contact with said stacked circuit boards at a rapid feed rate to a pulled-out position in which said pressure foot is in pressure contact with said stacked circuit boards and said drill is located just out of contact therewith, and moving said drill into said stacked circuit boards at an entry feed rate, which is lower than the rapid feed rate to initiate drilling at an intermediate portion of a first circuit board of said stacked circuit boards to be contacted by said drill while maintaining the pressure contact by the pressure foot;

moving said drill from the intermediate portion of said first circuit board at the rapid feed rate to the pulled-out position and then to a switchover position adjacent the intermediate portion while maintaining the pressure contact by the pressure foot; and moving said drill to another intermediate position of another circuit board of said stacked circuit boards at a drilling feed rate lower than the rapid feed rate while maintaining the pressure contact by the pressure foot.

19. A method of drilling a hole in a printed circuit board in which stacked printed circuit boards are fixed by a pressure foot for the drilling, comprising the steps of:

setting a drill start position at which said pressure foot is not in contact with said printed circuit boards, a pulled-out position at which the pressure of said pressure foot acts on said printed circuit boards and at which a drill bit is located just above said stacked printed circuit boards, a plurality of intermediate positions successively located at certain points in a depthwise direction of said hole, and a hole bottom position at which the drilling of said hole is completed;

setting an entry feed rate at which said drill bit initially drills said printed circuit boards, a drilling feed rate which ensures satisfactory drilling, and a rapid feed rate which is faster than said drilling feed rate;

repeating, after said drill has been fed from said drill start position to a first intermediate position with the pressure foot in contact with said printed circuit boards at said entry feed rate, a cycle which includes a step of feeding said drill from said first intermediate position to said pulled-out position with the pressure foot in contact with said printed circuit boards at said rapid feed rate and a step of feeding said drill from said pulled out position to a next intermediate position with the pressure foot in contact with said printed circuit boards at said drilling feed rate; and returning said drill to said drill start position at which the pressure foot is not in contact with said printed circuit boards at said rapid feed rate after said drill has reached said hole bottom position with the pressure foot in contact with said printed circuit boards.

20. A method of drilling a hole in a printed circuit board in which stacked printed circuit boards are fixed for drilling by a pressure foot for the drilling, comprising the steps of:

setting a drill start position at which said pressure foot is not in contact with said printed circuit boards, a pulled-out position at which the pressure of said pressure foot acts on said printed circuit boards and at which a drill bit is located just above said stacked printed circuit boards, a plurality of intermediate positions successively located at certain points in a depthwise direction of said hole at which the pressure foot acts on said printed circuit boards, switchover positions which are each located a predetermined distance above corresponding intermediate positions and at which the pressure foot acts on said printed circuit boards, and a hole bottom position at which the drilling of said hole is completed;

setting an entry feed rate at which said drill bit initially drills said printed circuit boards, a drilling feed rate which ensures satisfactory drilling, and a rapid feed rate which is faster than said drilling feed rate;

repeating, after said drill has been fed from said drill start position to said pulled-out position at said rapid feed rate, then from said pulled-out position to a first intermediate position at said entry feed rate, a cycle which includes a step of feeding said drill from said first intermediate position to a switchover position with the pressure foot in contact with said printed circuit boards via said pulled-out position at said rapid feed rate and a step of feeding said drill from said switchover position to a next intermediate position with the pressure foot in contact with said printed circuit boards at said drilling feed rate; and returning said drill to said drill start position at which the pressure foot is not in contact with said printed circuit boards at said rapid feed rate after said drill has reached said hole bottom position.

* * * * *